United States Patent [19]

Schenck et al.

[11] Patent Number: 4,471,292
[45] Date of Patent: Sep. 11, 1984

[54] MOS CURRENT MIRROR WITH HIGH IMPEDANCE OUTPUT

[75] Inventors: Stephen R. Schenck, McKinney; Terry J. Johnson, Dallas, both of Tex.

[73] Assignee: Texas Instruments Incorporated, Dallas, Tex.

[21] Appl. No.: 440,646

[22] Filed: Nov. 10, 1982

[51] Int. Cl.³ .............................................. G05F 3/20
[52] U.S. Cl. .................................. 323/315; 307/297; 330/288
[58] Field of Search ............... 307/297; 323/312, 315; 330/288

[56] References Cited

U.S. PATENT DOCUMENTS 4,399,374  8/1983  Boeke ................................. 307/297
4,399,375  8/1983  Sempel ................................ 307/297

Primary Examiner—William M. Shoop
Attorney, Agent, or Firm—Douglas A. Lashmit; Melvin Sharp; N. Rhys Merrett

[57] ABSTRACT

An improved MOS current mirror wherein the mirror transistors are biased to operate in the saturated region near the boundary between the linear and the saturated regions to maximize the voltage gain and the power supply rejection ratio while maintaining a high output impedance.

13 Claims, 4 Drawing Figures

MOS CURRENT MIRROR WITH HIGH IMPEDANCE OUTPUT

BACKGROUND OF THE INVENTION

This invention relates generally to semiconductor circuits, and more particularly to an improved current mirror circuit using metal-oxide-semiconductor (MOS) field-effect transistors.

A current mirror is a current-controlled current source wherein the current output is constant for a given current input. Typical applications of this circuit include bandgap voltage references, operational amplifiers and comparators. In complementary MOS (CMOS) applications using this circuit high impedance stages are desirable for high gain, low offset, and high power supply rejection ratio. One method of meeting these requirements is to use stages with cascoded outputs. A typical circuit having cascoded outputs requires a voltage equal to twice the gate to source voltage, or 2 $V_{GS}$, on the input and a voltage equal to the difference between this voltage and the threshold voltage, or ($2 V_{GS}-V_T$), on the output for proper operation. However, this prevents the output from directly driving a subsequent stage requiring only one $V_{GS}$ on its input unless a level translating circuit is included.

SUMMARY OF THE INVENTION

Accordingly, the present invention provides an improved MOS current mirror wherein the mirror transistors are biased in the saturated region on or near the boundary between the linear region and the saturated region in order to maximize the voltage gain and the power supply rejection ratio while maintaining a high output impedance at voltages down to $2 (V_{GS}-V_T)$.

In one embodiment of the present invention the mirror transistors are biased by means of a second cascoded stage in combination with a series-parallel stage of three transistors having a common gate connection.

In another embodiment the bias voltage is obtained by using a MOS transistor having a threshold voltage different from the threshold voltage of the mirror transistors.

In yet another embodiment a second cascoded stage is biased by a single transistor connected to a bias current source wherein the bias current is related to the mirror input current.

BRIEF DESCRIPTION OF THE DRAWINGS

Other objects and many of the attendant advantages of the present invention will be readily apparent as the invention becomes better understood by reference to the following detailed description with the appended claims, when considered in conjunction with the accompanying drawings, wherein:

DETAILED DESCRIPTION OF THE INVENTION

Figure 1:
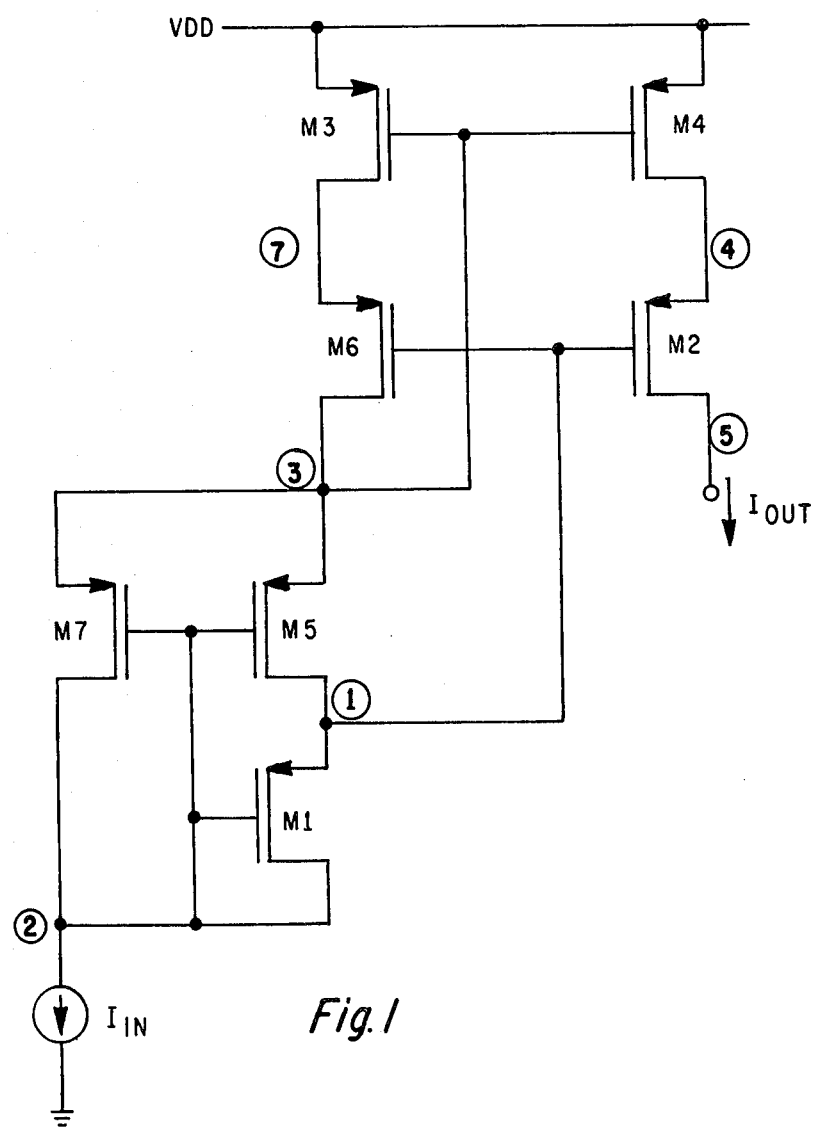
FIG. 1 is a schematic diagram of a current mirror circuit according to one embodiment of the present invention.

Referring now to the drawings, there is shown in FIG. 1 a current mirror circuit according to one embodiment of the present invention. Although the circuit is illustrated with p-channel MOS transistors, it will be readily apparent to those skilled in the art that n-channel devices may also be employed.

Figure 2:
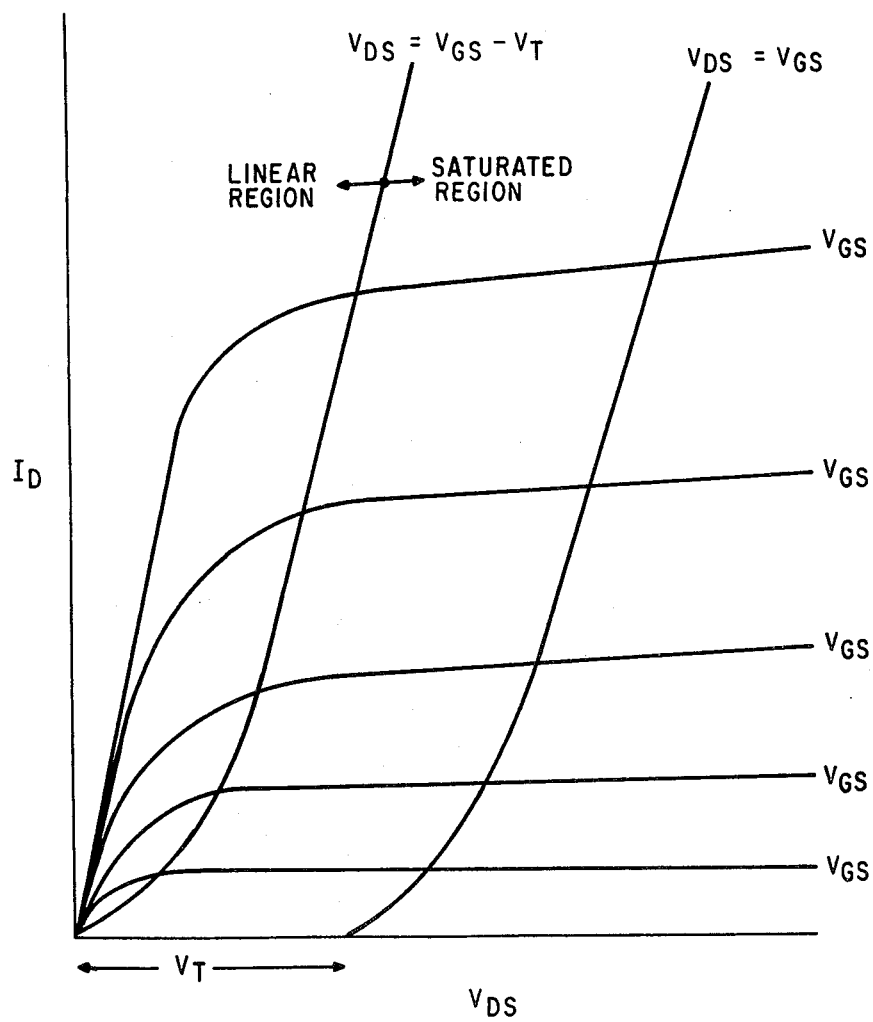
FIG. 2 is a graphical representation of the output characteristics for a typical p-channel MOS transistor.

The basic current mirror is formed of two MOS transistors M3 and M4 having their gates connected together and their sources connected to a supply voltage $V_{DD}$. To optimize the operation of the current mirror M3 and M4 are biased to operate in the saturated region on or near the boundary between the linear and saturated regions, that is, the output characteristic is:

$$V_{DS}=V_{GS}-V_T$$

where
$V_{DS}$=drain to source voltage
$V_{GS}$=gate to source voltage
$V_T$=threshold voltage The output characteristic is shown in FIG. 2, which is a graph of drain current as a function of drain to source voltage ($I_D$ vs. $V_{DS}$) for a p-channel MOS device at various gate to source voltages, $V_{GS}$.

Transistors M6 and M2 form a second stage of the current mirror wherein their gates are connected together and their sources are connected to the drains of M3 and M4, respectively. The drain of M2 is the output, node 5, of the mirror. The drain of M6 is connected to the sources of M5 and M7, the drain of M5 is connected to the source of M1, and the drain of M1 is connected to the drain of M7 as well as the gates of M1, M5 and M7, which forms the input node 2. The source of M5 is connected to the M3-M4 gates, and the drain of M5 is connected to the M2-M6 gates.

The relative dimensions and current densities of M7 and M5 are selected so that substantially all of the current in the series-parallel combination of M1-M5 and M7 passes through M7. Because the gate of M7 is connected to its drain, M7 operates on the $V_{DS}=V_{GS}$ line, shown in FIG. 2, and node 3 in FIG. 1 is thus $V_{GS}$ volts above node 2. Further, since the gate of M3 is connected to node 3, node 2 is ($V_{GSM7}+V_{GSM3}$), or approximately $2 V_{GS}$ volts below $V_{DD}$. Almost no current passes through M5 to M1, thus the voltage across M1, i.e., node 1 minus node 2, is the threshold voltage, $V_T$, since M1 is diode-connected. The voltage difference between node 3 and node 1, i.e., the source to drain voltage of M5, is therefore ($V_{GS}-V_T$). Further, since the voltage at node 1 is applied to the gates of M6 and M2, nodes 7 and 4 are ($V_{GS}+V_T$) above node 2.

From the foregoing, the following equalities are apparent:

$$V_{SDM3}=V_{SDM4}=V_{DD}-V_{N7}=V_{DD}-V_{N4}$$

$$V_{DD}=V_{N2}+2V_{GS}$$

$$V_{N7}=V_{N4}=V_{N2}+V_{GS}+V_T$$

$$V_{SD(M3,M4)}=(V_{N2}+2V_{GS})-(V_{N2}+V_{GS}+V_T)$$

thus, for transistors M3 and M4

$$V_{SD}=V_{GS}-V_T$$

where
V_{DD}=supply voltage
V_{SD}=source to drain voltage
V_{NX}=voltage at node X
V_{GS}=gate to source voltage
V_T=threshold voltage Transistors M3 and M4 therefore operate on the characteristic line ($V_{GS}-V_T$), and the output voltage can approach to within $2(V_{GS}-V_T)$ of the supply voltage because of the two stages of the current mirror.

Figure 3:
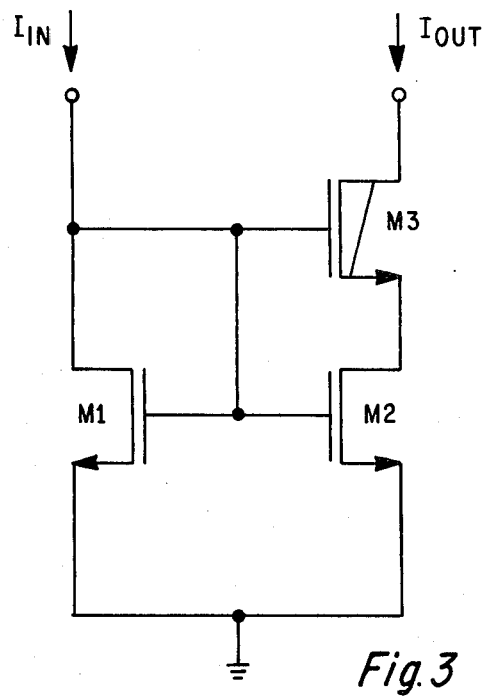
FIG. 3 is a schematic diagram of a second embodiment of the current mirror circuit of the present invention.

Referring now to FIG. 3 there is shown a second embodiment of the present invention wherein a current mirror is formed of two n-channel MOS transistors M1 and M2. M3 is a "natural" threshold device in which the unadjusted threshold voltage is typically about 0.6 volts less than the threshold voltage of M2. This difference in $V_T$, together with the proper selection of current densities for the devices, forces M1 and M2 to operate at or near the boundary between the linear and saturated regions as in the above-described embodiment. Of course, p-channel devices may also be used if the threshold voltage of M3 is adjusted to be sufficiently lower than that of M2.

Figure 4:
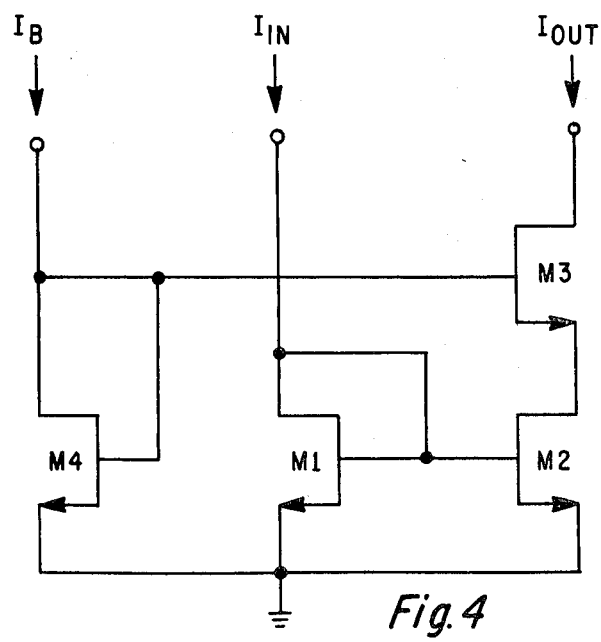
FIG. 4 is a schematic diagram of a third embodiment of the current mirror.

FIG. 4 shows a third embodiment of the invention wherein n-type MOS transistors M1 and M2 form the first stage of a current mirror with the input current passing through M1 and the output current passing through M2. M3 forms the second stage of the current mirror, as in the previous embodiments, with the source of M3 being connected to the drain of M2. In some applications it may be desirable to include a transistor series connected to M1, however, the illustrated embodiment shows the minimum number of transistors required to use this particular bias circuit. The gate and drain of a fourth transistor M4 are connected together and to the gate of M3 to provide the M3 bias voltage, which is also the gate to source voltage of M4. The source of M4 is connected to the sources of M1 and M2. The bias voltage is generated by a bias current $I_B$ passing through M4. $I_B$ is related to $I_{IN}$ so that as $I_{IN}$ changes the gate voltage on M3 will vary accordingly. The relative dimensions of M4 and the magnitude of $I_B$ are selected to that M2 is in the saturated region, at or near the boundary between the linear and saturated regions, over the desired operating range of the current mirror, that is, $V_{GS}$ of M4 must be greater than $V_{GS}$ of M1 and M2. $I_B$ may conveniently be generated by a current mirror (not shown) which also generates $I_{IN}$. This circuit thus achieves the desired high impedance output with a minimum number of transistors.

Other embodiments and modifications of the present invention will readily come to those of ordinary skill in the art having the benefit of the teachings presented in the foregoing description and drawings. It is therefore to be understood that this invention is not to be limited thereto and that said modifications and embodiments are intended to be included within the scope of the appended claims.

What is claimed is:

1. A current source circuit comprising:
field-effect transistor means for generating an output current proportional to an input current; and
means for biasing said generating means to operate in the saturated region at or near the boundary between its linear and saturated regions.

2. The circuit of claim 1 wherein said current generating means comprises:
a first MOS transistor through which said input current passes; and
a second MOS transistor through which said output current passes wherein the source and gate of said second transistor are connected to the source and gate, respectively, of said first transistor.

3. The circuit of claim 2 wherein said biasing means comprises:
a third MOS transistor having a source connected to the drain of said first transistor;
a fourth MOS transistor having a source connected to the drain of said second transistor and a gate connected to the gate of said third transistor, wherein the drain of said fourth transistor is the output of said current source circuit;
a fifth MOS transistor having a source connected to the drain of said third transistor and to the gates of said first and second transistors;
a sixth MOS transistor having a source connected to the drain of said fifth transistor and to the gates of said third and fourth transistors; and
a seventh MOS transistor having a source connected to the source of said fifth transistor, and a drain connected to the drain of said sixth transistor and to the gates of said fifth, sixth and seventh transistors, wherein the drain of said seventh transistor is the input of said current source circuit.

4. The circuit of claim 3 wherein the relative current densities of said fifth and said seventh transistors are such that substantially all of said input current passes through said seventh transistor.

5. The circuit of claim 4 wherein said MOS transistors are p-channel devices.

6. The circuit of claim 4 wherein said MOS transistors are n-channel devices.

7. The circuit of claim 2 wherein said biasing means comprises:
a third MOS transistor having a threshold voltage less than the threshold voltage of said second transistor, wherein the source of said third transistor is connected to the drain of said second transistor, the gate of said third transistor is connected to the gates of said first and second transistors and to the drain of said first transistor, and the drain of said third transistor is the output of said current source circuit.

8. The circuit of claim 7 wherein said MOS transistors are p-channel devices.

9. The circuit of claim 7 wherein said MOS transistors are n-channel devices.

10. The circuit of claim 2 wherein said biasing means comprises:
a third MOS transistor having a source connected to the drain of said second transistor wherein the drain of said third transistor is the ouptut of said current source circuit;
a fourth MOS transistor having a drain connected to its gate and to the gate of said third transistor, and a source connected to the sources of said first and second transistors; and
a bias current source connected to the drain of said fourth transistor wherein the magnitude of said bias current is related to the input current magnitude.

11. The circuit of claim 10 wherein said MOS transistors are p-channel devices.

12. The circuit of claim 10 wherein said MOS transistors are n-channel devices.

13. A current source circuit comprising:
a plurality of cascoded field-effect transistor devices for generating an output current proportional to an input current; and
means for biasing said cascoded devices to produce an output voltage less than the threshold voltage of said cascoded devices.

* * * * *